United States Patent [19]

Kumano

[11] Patent Number: 5,545,914
[45] Date of Patent: Aug. 13, 1996

[54] SEMICONDUCTOR DEVICE HAVING ZENER DIODES WITH TEMPERATURE STABILITY BETWEEN BASE AND COLLECTOR REGIONS

[75] Inventor: Hiroshi Kumano, Kyoto, Japan

[73] Assignee: Rohm Co., Ltd, Kyoto, Japan

[21] Appl. No.: 324,611

[22] Filed: Oct. 18, 1994

[30] Foreign Application Priority Data

Oct. 27, 1993 [JP] Japan .................................. 5-268541

[51] Int. Cl.$^6$ ...................... H01L 29/732; H01L 29/866
[52] U.S. Cl. ........................ 257/469; 257/546; 257/362; 257/551; 327/421; 327/513
[58] Field of Search ...................................... 257/469, 546, 257/362, 551; 327/421, 512, 513

[56] References Cited

U.S. PATENT DOCUMENTS

| | | | |
|---|---|---|---|
| 3,780,322 | 12/1973 | Walters | 327/512 |
| 4,030,023 | 6/1977 | Keith | 327/513 |
| 4,748,533 | 5/1988 | Hertrich et al. | 327/421 |
| 4,903,095 | 2/1990 | Chapron | 257/546 |
| 4,984,031 | 1/1991 | Rinderle | 257/546 |
| 5,365,099 | 11/1994 | Phipps et al. | 257/469 |

*Primary Examiner*—Jerome Jackson, Jr.
*Attorney, Agent, or Firm*—Nikaido Marmelstein Murray & Oram LLP

[57] ABSTRACT

A plurality of Zener diodes are connected between two electrodes of a transistor as the protector of the transistor to obtain a predetermined breakdown voltage. Each Zener diode has a breakdown of 5 V whose temperature coefficient is substantially zero.

3 Claims, 5 Drawing Sheets

5,545,914

SEMICONDUCTOR DEVICE HAVING ZENER DIODES WITH TEMPERATURE STABILITY BETWEEN BASE AND COLLECTOR REGIONS

BACKGROUND OF THE INVENTION

1. Field of the Invention

The present invention relates to a semiconductor device, and more particularly, to a semiconductor device such as a discrete transistor, a metal oxide semiconductor (MOS) device and an integrated circuit of a structure having a breakdown voltage structure between two electrodes of a transistor.

2. Description of the Prior Art

Generally, in an input transistor, a Zener diode is connected between two electrodes to protect the transistor from a surge voltage. In a bipolar transistor, as shown in FIG. 1, a Zener diode ZD having a predetermined breakdown voltage is connected between a base B and a collector C. In a MOS transistor, as shown in FIG. 2, Zener diodes ZDa and ZDb having a predetermined breakdown voltage are connected between the gate G and the source S. In FIG. 2, the diodes ZDa and ZDb are connected to be of back-to-back polarity.

These Zener diodes are formed to have a specific breakdown voltage such as 5 V, 15 V, 30 V and 90 V according to the purpose of the transistor. While the Zener diodes are ordinarily formed within an integrated circuit chip in an integrated circuit, in a discrete transistor, Zener diodes are frequently formed on the semiconductor substrate together with the transistor.

When a semiconductor device is incorporated in a television receiver set, if heat is not released in the semiconductor device because of defective heat release, the breakdown voltage of the Zener diode is changed. For example, the breakdown voltage of a Zener diode designed to have a breakdown voltage of 30 V is increased to 40 V when the temperature increases, so that a transistor cannot sufficiently be protected from a surface voltage of from 30 V to 35 V. As a result, a problem is caused in the operation of the receiver set.

SUMMARY OF THE INVENTION

An object of the present invention is to provide a semiconductor device having a breakdown voltage means whose breakdown voltage does not change with a temperature change.

According to the present invention, in a semiconductor device having a breakdown voltage means between two electrodes of a transistor. The breakdown voltage means includes a plurality of Zener diodes, each having a breakdown voltage is a range where both an avalanche effect and a tunnel effect exist to a same, and which are connected in series to obtain a predetermined breakdown voltage. Since, for example, a breakdown voltage of 30 V is obtained by connecting six Zener diodes of a breakdown voltage of 5 V in series and the breakdown voltage of each Zener diode does not change due to a temperature change, the total breakdown voltage hardly changes. Specifically, in the Zener diode of a breakdown voltage of 5 V, the avalanche effect and the tunnel effect are both present. Therefore, when the temperature increases, the breakdown voltage increases due to the avalanche effect and decreases due to the tunnel effect, so that the changes in breakdown voltage due to different phenomena are cancelled by each other. As a result, the temperature coefficient of the breakdown voltage is substantially zero.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
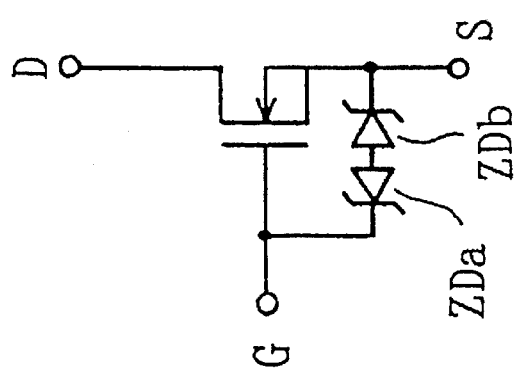
FIG. 1 is a circuit diagram showing a protecting structure between the base and the collector of a conventional bipolar transistor device.
Figure 2:
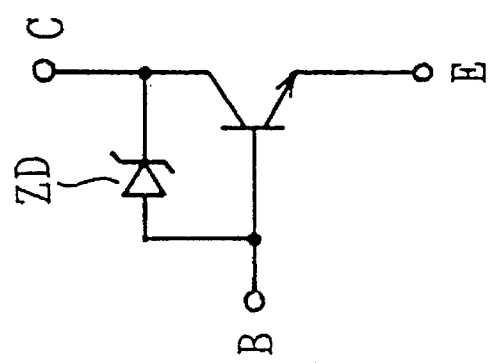
FIG. 2 is a circuit diagram showing a protecting structure between the base and the collector of a conventional MOS transistor device.
Figure 3:
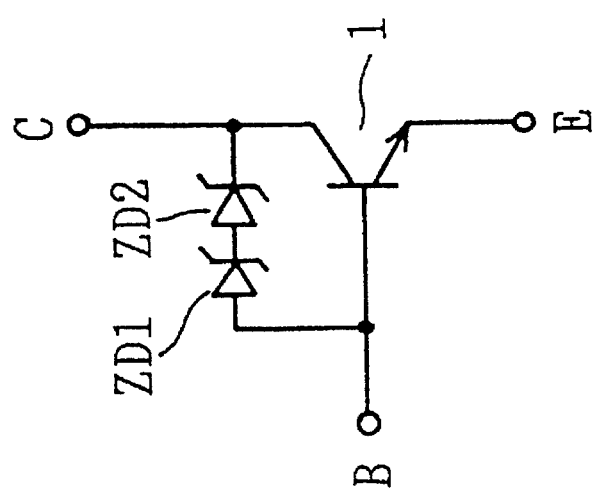
FIG. 3 is a circuit diagram showing a protecting structure between the base and the collector of a bipolar transistor embodying the present invention.
Figure 4:
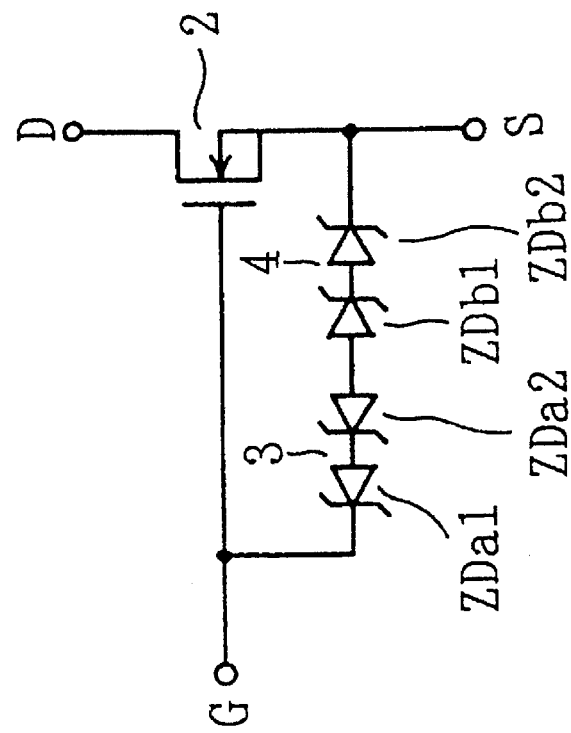
FIG. 4 is a circuit diagram showing a protecting structure between the base and the collector of a MOS transistor device embodying the present invention.

The present invention will hereinafter be described with reference to the drawings. FIG. 3 shows an example in which Zener diodes ZDa1 and ZDa2 of a breakdown voltage of 5 V are connected in series between a base B and a collector C of an NPN-type transistor 1 to form a breakdown voltage means of a breakdown voltage of 10 V. FIG. 4 shows an example in which Zener diodes ZDa1, ZDa2, ZDb1 and ZDb2 of a breakdown voltage of 5 V are connected as shown in the figure between a gate G and a source S of an N-type MOS transistor, the Zener diodes ZDa1 and ZDa2 constitute a first breakdown voltage means 3 of a breakdown voltage of 10 V, the Zener diodes ZDb1 and ZDb2 constitute a second breakdown voltage means 4 of a breakdown voltage of 10 V, and the first and second breakdown voltage means are connected to be of back-to-back polarity.

In the embodiment of FIG. 3, two Zener diodes are connected in series since these are examples for obtaining a breakdown voltage of 10 V. The number of Zener diodes connected in series depends on the value of the required breakdown voltage. For example, when a breakdown voltage of 20 V is required, four Zener diodes are connected in series, and when a breakdown voltage of 30 V is required, six Zener diodes are connected in series.

A feature of the embodiment is to obtain a necessary breakdown voltage by using a plurality of Zener diodes having a breakdown voltage of 5 V instead of providing a single Zener diode with a breakdown voltage of, for example, 10 V, 20 V and 30 V. The advantages of this feature will be described. First, the following two are the factors of the temperature mechanism of the breakdown voltage by a diodes:

(A) The mean free path of carriers in a semiconductor decreases when the temperature of crystallization increases. For this reason, to obtain a necessary energy for impact ionization, a higher voltage is required, so that the breakdown voltage increases.

(B) When the temperature of crystallization increases, carriers are apt to shift from the valence band directly to the conduction band across the depletion layer, so that the breakdown voltage decreases.

In (A), the avalanche effect is dominant, and in (B), the tunnel effect is dominant. In a silicon semiconductor, the breakdown voltage in the border between (A) and (B) is approximately 5 V. When the breakdown voltage is higher than 5 V, the factor (A) is dominant, and when the breakdown voltage is lower than 5 V, the factor (B) is dominant. In other words, since (A) and (B) are both present at the breakdown voltage of approximately 5 V, the breakdown voltage tends to increase by the avalanche effect of (A) and tends to decrease by the tunnel effect of (B). For this reason, the changes of the breakdown voltage offset each other, so that a temperature coefficient $\Delta V_z/T$ ($\Delta V_z$ is a change in breakdown voltage, and T is a temperature) is substantially zero.

While Zener diodes of a breakdown voltage of 5 V are used in the present embodiments, in the breakdown voltage range (5.0 V to 6.0 V) where (A) and (B) are both present, the breakdown voltage does not have to be 5 V. The breakdown voltage may be chosen from the values included in the range.

Figure 5:
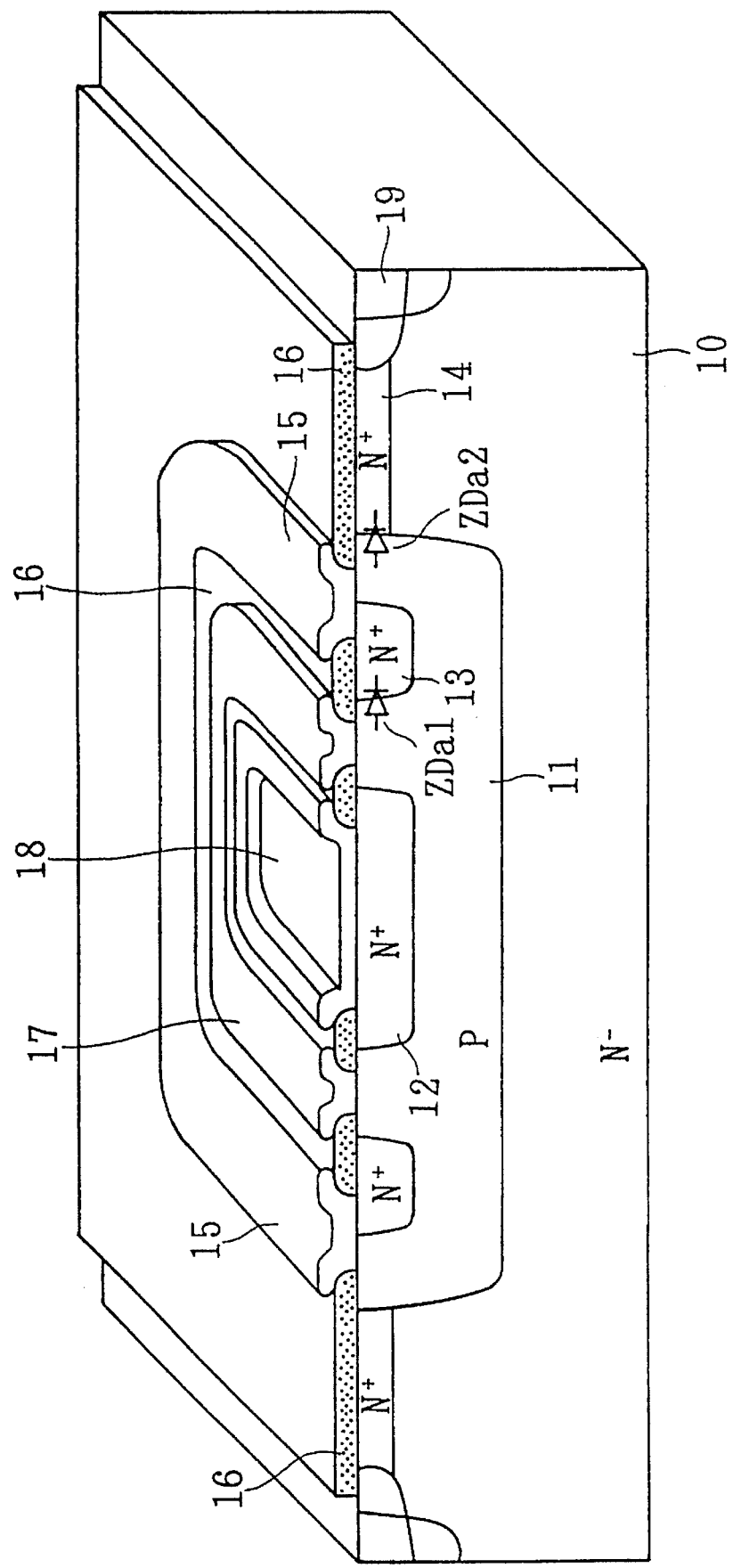
FIG. 5 is a cross-sectional view of a semiconductor device showing a first structure example of the device of FIG. 3.

Subsequently, the structure of the semiconductor device of FIG. 3 will be described with reference to FIG. 5. In FIG. 5, a P-layer 11 is formed in an N-type semiconductor substrate 10, and an $N^+$-layer 12 is formed in the P-layer 11. The substrate 10 serves as the collector, the 11 serves as the source, and the $N^+$-layer 12 serves as the emitter. Thus, an NPN transistor is formed.

In the P-layer 11, an $N^+$-layer 13 is further formed. On the surface of the substrate 10 adjoining the right side of the P-layer 11, an $N^+$-layer 14 is formed by ion implantation. An aluminum film 15 is formed as shown in the figure so as to be in contact with both the $N^+$-layer 13 and the P-layer 11. The Zener diode ZDa1 is formed by a PN-junction of the P-layer 11 and the $P^+$-layer 13. The Zener diode ZDa2 is formed by a PN-junction of the P-layer 11 and the $N^+$-layer 14. The two Zener diodes ZDa1 and ZDa2 are connected through the aluminum film 15. The cathode of the Zener diode ZDa2 is connected to the substrate 10 (i.e. collector). The semiconductor device of a structure as shown in FIG. 3 is thus realized.

In FIG. 5, reference numeral 16 is an $S_iO_2$ insulating film, reference numeral 17 is a base electrode made of an aluminum film, and reference numeral 18 is an emitter electrode similarly made of an aluminum film. As the collector electrode, the undersurface of the substrate 10 is used. Reference numeral 19 is a guard ring.

While the semiconductor device is cut in half in FIG. 5, in the entire structure, the Zener diodes ZDa1 and ZDa2 are each formed to be ring-shaped and are formed around the transistor. This ring configuration remarkably increases the current capacities of the Zener diodes. The ring does not have to be a complete ring. It may be intermittent. In any case, the current capacities can be increased by forming the Zener diodes to be ring-shaped. The current capacities can also be increased by forming the diodes not to be a ring-shaped but to be comparatively long around the transistor.

Figure 6:
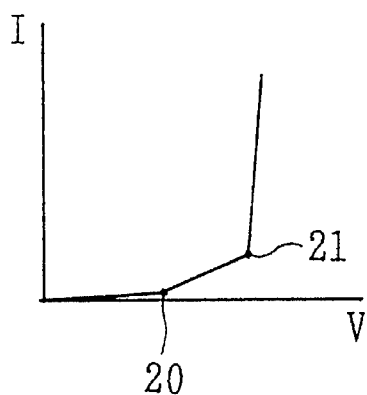
FIG. 6 shows a characteristic of a Zener diode thereof.

FIG. 6 shows the total Zener characteristic of the Zener diodes ZDa1 and ZDa2. In this figure, the longitudinal axis represents a current I, and the lateral axis represents a voltage V.

Here, the Zener diode ZDa2 is broken down at point 20, and the Zener diode ZDa1 is broken down at point 21. The breakdown of the PN-junction including the $N^+$-layer 14 thus precedes the breakdown of the PN-junction including the $N^+$-layer 13. The reason therefor is as follows: when the voltage is increased, first, the Zener diode ZDa2 is broken down and the current flows through the resistance of the P-layer 11, and when the voltage is further increased, the Zener diode ZDa1 which is the junction of the P-layer 11 and the $N^+$-layer 13 is broken down and the current flows therethrough.

Figure 7:
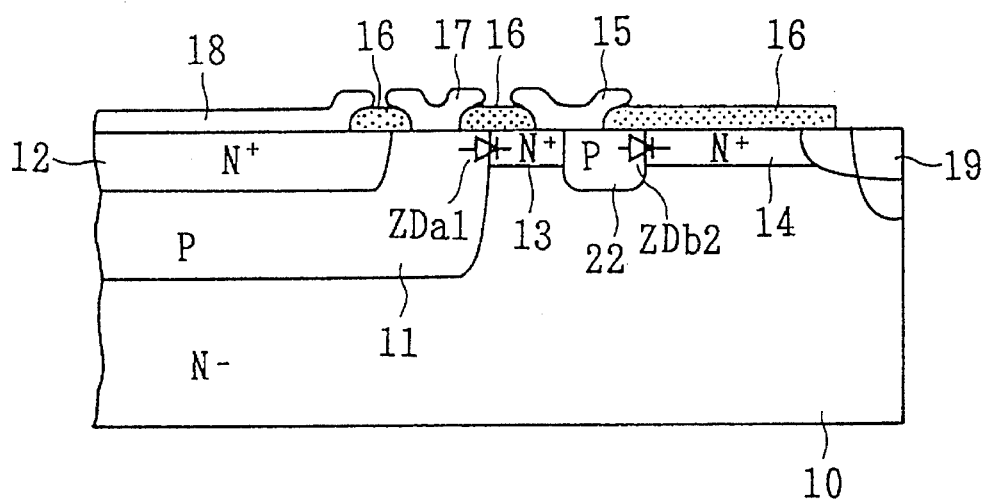
FIG. 7 is a cross-sectional view of a semiconductor device showing a second structure example of the device of FIG. 3.
Figure 8:
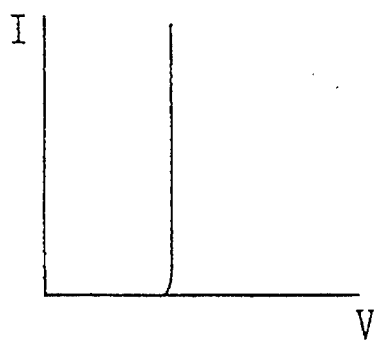
FIG. 8 shows a characteristic of a Zener diode thereof.

FIG. 7 shows an embodiment in which the $N^+$-layer 13 of the Zener diode ZDa1 is formed not in the P-layer 11 but directly in the substrate 10 by ion implantation and a P-layer 22 is further formed. The other portions are the same as those of FIG. 5. According to the embodiment of FIG. 7, since the two PN-junctions (i.e. Zener diodes ZDa1 and ZDa2) are simultaneously broken down as shown in FIG. 8, the breakdown characteristic is steep compared to that of FIG. 6.

Figure 9:
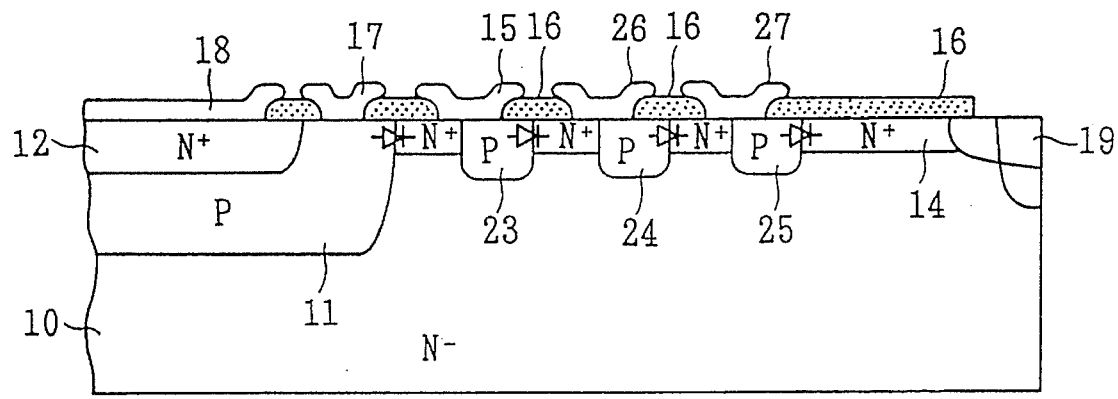
FIG. 9 is a cross-sectional view of a semiconductor device showing a third structure example of the device of FIG. 3.

FIG. 9 shows an embodiment in which four Zener diodes of a breakdown voltage of 5 V are connected in series to obtain a breakdown voltage of 20 V. On the substrate 10, three P-layers 23, 24 and 25 and two aluminum films 26 and 27 are added between the P-layer 11 and the $N^+$-layer 14.

Figure 10:
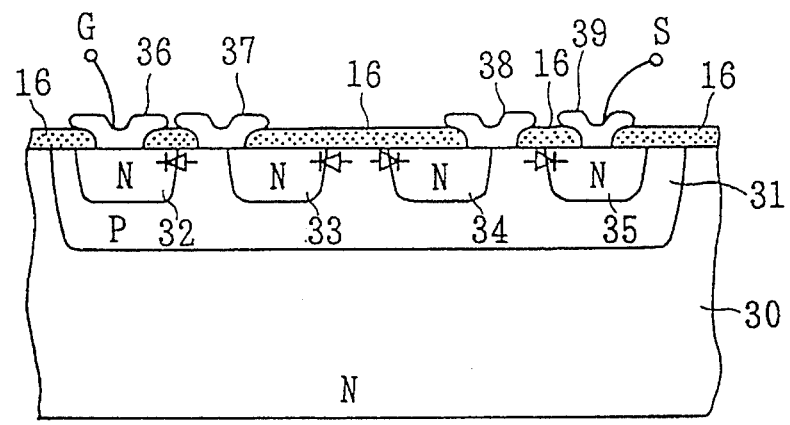
FIG. 10 is a cross-sectional view of a semiconductor device showing a fourth structure example of the device of FIG. 4.

FIG. 10 shows the structure of the semiconductor device of FIG. 4. The Zener diodes formed at the end rather than the MOS transistor formed on the substrate 30 are shown. P-layer 31 is formed in the substrate 30, and four N-layers 32 to 35 are formed in the P-layer 31. The N-layer 32 is connected to a gate electrode G through an aluminum film 36, and the N-layer 35 is connected to source electrodes through an aluminum film 39.

Figure 11:
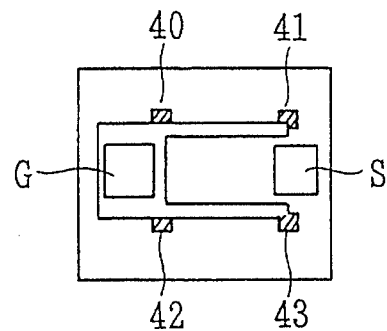
FIG. 11 is a schematic plan view of the device of FIG. 10.

In addition, an aluminum film 37 in contact with both the N-layer 33 and the P-layer 31 and an aluminum film 38 in contact with both the N-layer 34 and the P-layer 31 are provided. FIG. 11 is a plan view of the semiconductor device of FIG. 10. The substrate serves as the drain, the source electrode S and the gate electrode G are formed at positions shown in the figure, and the Zener diodes shown in FIG. 10 are formed at four points shown at 40 to 43 (to increase the current capacity, the structure of FIG. 10 is formed at four points). Thus, the Zener diodes are not formed to be ring-shaped.

In the above description, $P^+$ and $N^+$ represent a P-type semiconductor layer and an N-type semiconductor layer having high impurity concentrations, respectively. These layers are formed in the upper portion of the substrate 10.

As described above, according to the present invention, since the breakdown voltage of the breakdown voltage means is not influenced by the temperature, the breakdown voltage which the breakdown voltage means is designed to have is maintained to increase the reliability. Further, since the structural elements are formed to be ring-shaped, the current capacity increases.

Obviously, many modifications and variations of the present invention are possible in light of the above teachings. It is therefore to be understood that within the scope of the appended claims, the invention may be practiced other than as specifically described.

What is claimed is:

1. A semiconductor device comprising:

a semiconductor substrate functioning as a collector;

a base region of a conductivity type opposite to a conductivity type of the semiconductor substrate, the base region being formed in the semiconductor substrate;

an emitter region of a conductivity type a same as the conductivity type of the semiconductor substrate, the emitter region being formed in the base region;

a first region of a conductivity type a same as the conductivity type of the semiconductor substrate, the first region having a high impurity concentration and being formed in an upper part of the base region, the first region and the base region forming a first Zener diode;

a second region of a conductivity type a same as the conductivity type of the semiconductor substrate, the second region having a high impurity concentration and being formed in an upper part of the semiconductor substrate to surround the base region so as to adjoin the base region, the second region and the base region forming a second Zener diode; and a metallic layer formed on the semiconductor substrate so as to be in contact both with the first region and with the base region forming the second Zener diode, wherein the semiconductor substrate, the base region and the emitter region form a transistor, and wherein the first and second Zener diodes are formed in a ring to surround the transistor, and wherein the first and second Zener diodes each have a breakdown voltage in a range where both an avalanche effect and a tunnel effect exist in a same degree, and wherein by a sum of the breakdown voltages, a breakage which is caused between a collector and a base of the transistor due to an overvoltage is prevented.

2. A semiconductor device comprising:

a semiconductor substrate functioning as a collector;

a base region of a conductivity type opposite to a conductivity type of the semiconductor substrate, the base region being formed in the semiconductor substrate;

an emitter region of a conductivity type a same as the conductivity type of the semiconductor substrate, the emitter region being formed in the base region;

a first region of a conductivity type a same as the conductivity type of the semiconductor substrate, the first region having a high impurity concentration and being formed in an upper part of the semiconductor substrate to surround the base region so as to adjoin the base region, the base region and the first region forming a first Zener diode;

a second region of a conductivity type opposite to the conductivity type of the semiconductor substrate, the second region having a high impurity concentration and being formed in an upper part of the semiconductor substrate to surround the first region so as to adjoin the first region;

a third region of a conductivity type a same as the conductivity type of the semiconductor substrate, the third region having a high impurity concentration and being formed in an upper part of the semiconductor substrate to surround the second region so as to adjoin the second region, the second region and the third region forming a second Zener diode; and a metallic layer formed on the semiconductor substrate so as to be in contact both with the first and second regions, the metallic layer connecting the first and second Zener diodes in series, wherein the semiconductor substrate, the base region and the emitter region form a transistor, and wherein the first and second Zener diodes are formed in a ring to surround the transistor, and wherein the first and second Zener diodes each have a breakdown voltage in a range where both an avalanche effect and a tunnel effect exist in a same degree, and wherein by a sum of the breakdown voltages, a breakage which is caused between a collector and a base of the transistor due to an overvoltage is prevented.

3. A semiconductor device comprising:

a semiconductor substrate functioning as a collector;

a base region of a conductivity type opposite to a conductivity type of the semiconductor substrate, the base region being formed in the semiconductor substrate;

an emitter region of a conductivity type a same as the conductivity type of the semiconductor substrate, the emitter region being formed in the base region;

a plurality of regions formed so as to be arranged from an end of the base region to surround the base region in a manner such that different conductivity types are alternatively arranged; and a metallic layer fromed on the semiconductor substrate to be in contact with an adjoining region so as to connect adjoining regions of the plurality of regions, wherein the semiconductor substrate, the base region and the emitter region form a transistor, and wherein the plurality of regions form a plurality of Zener diodes, and wherein the base region forms a part of one of the plurality of Zener diodes, and wherein the plurality of Zener diodes are formed in a ring to surround the transistor, and wherein the plurality of Zener diodes each have a breakdown voltage in a range where both an avalanche effect and a tunnel effect exist in a same degree, and wherein by a sum of the breakdown voltages, a breakage which is caused between a collector and a base of the transistor due to an overvoltage is prevented.

* * * * *